United States Patent [19]
Lutz

[11] 3,986,045
[45] Oct. 12, 1976

[54] HIGH SPEED LOGIC LEVEL CONVERTER

[75] Inventor: Robert Clare Lutz, Sunnyvale, Calif.

[73] Assignee: Advanced Micro Devices, Inc., Sunnyvale, Calif.

[22] Filed: Apr. 23, 1975

[21] Appl. No.: 570,742

[52] U.S. Cl............................ 307/207; 307/DIG. 1; 307/235 T; 307/317 A
[51] Int. Cl.² ........................................ H03K 17/00
[58] Field of Search....... 307/DIG. 1, 317 A, 235 K, 307/235 T, 235 L, 297

[56] References Cited
UNITED STATES PATENTS

| | | | |
|---|---|---|---|
| 3,751,680 | 8/1973 | Hodges | 307/317 A |
| 3,766,406 | 10/1973 | Bryant et al. | 307/DIG. 1 |
| 3,823,330 | 7/1974 | Rapp | 307/DIG. 1 |

Primary Examiner—Stanley D. Miller, Jr.
Assistant Examiner—B. P. Davis
Attorney, Agent, or Firm—Jerald E. Rosenblum; Thomas Schneck, Jr.

[57] ABSTRACT

A two branch circuit for converting dual complementary signals characterizing emitter coupled logic to a single signal characterizing transitor-transistor logic. A two branch circuit supplies translation between ECL input signals, referenced to a voltage supply and TTL output signals, referenced to ground, using a current summing node receiving current from both branches and connected to a TTL output driver. A first circuit branch includes a feedback loop which generates a reference current summed with the current in the second branch.

11 Claims, 5 Drawing Figures

HIGH SPEED LOGIC LEVEL CONVERTER

BACKGROUND OF THE INVENTION

1. Field

The present invention relates to interface circuits, and more particularly to an interface circuit for providing signal level translation between an emitter coupled logic circuit, hereafter referred to as ECL, and a transistor-transistor logic circuit, hereafter referred to as TTL.

2. Background

Historically in the field of semiconductor integrated circuits, ECL has not been favored for small numbers of circuit functions because of the requirement to provide a reference voltage, usually designated $V_{BB}$, plus at least one current source for each function. However as the requirement for increased speed in circuit applications has continued, the benefits of ECL, which is inherently a faster, lower power consuming logic system, have been more attractive in those applications where reference voltages and current sources can be provided without undue economic burden. Such a situation exists in integrated circuit bipolar memory where high speed access times and low power consumption are required. In such an application a common reference voltage, $V_{BB}$, and a common current sourcing system can be provided to the entire memory array, memory address decoders and associated memory control circuits. Here, ECL can be implemented without undue economic burden.

While ECL logic is favored for certain logic functions, as described above, because of logic efficiency and other considerations not available in TTL, TTL logic is favored for certain other logic functions, gates and output driving means. Hence, it is desirable to design integrated bipolar memory such that the internal circuitry is of the higher performance ECL type while the input and output circuits are logic level compatible with the TTL logic form.

Previously, conversion of the internal ECL logic signals to TTL signals at the output has been accomplished with resistors and zener diodes. Additionally, some schemes using multiple stages of transistor amplification in series have been devised. All of these approaches significantly increase the total memory circuit access time which is undesirable and, to a great extent, reduce the advantage of using internal ECL circuitry. In some of these cases, translation schemes requiring more than one power supply voltage have been used. It is a highly desirable to use only one power supply to support both the internal ECL and the TTL interface circuits.

To do with one supply, zener diodes are unsatisfactory because the reference voltage, $V_{BB}$, of ECL is not fixed in an absolute sense but may vary in a system. Furthermore, the voltage drop across zener diodes is usually too high, and zener diodes provide a fixed voltage drop which cannot be used to satisfactorily achieve a voltage referenced to ground suitable for the TTL output interface logic.

On the other hand, when resistors are used, a satisfactorily uniform voltage referenced to ground can be achieved at the output since resistors do not provide a fixed voltage drop, but merely voltage division based upon current therethrough, but are unsatisfactory for the reason that they consume too much power and have a large time constant which is associated with actual and ambient capacitance.

Therefore, it is an object of the present invention to develop an interface between an ECL circuit and a TTL circuit, both of which operate from the same single supply voltage, which will translate from relative reference voltage levels near $V_{BB}$, which is fundamentally referenced to the supply voltage, to TTL levels referenced to ground, and therefore not sensitive to $V_{BB}$, yet which operates at the same high speed which characterizes ECL.

A further object is to provide a logic level converter which is insensitive to temperature.

Still another object is to devise an ECL to TTL logic level converter which from the standpoint of the TTL circuit appears to have the output impedance characteristics of a typical TTL circuit.

A further object is to devise an ECL to TTL logic level converter which is fully compatible with three state TTL logic, wherein one of the states is a disabled state; i.e., the circuit configuration and output impedance of the converter must readily interface with conventional three state circuit disabling circuitry.

SUMMARY

The above objectives are achieved with a two branch, differential input circuit in which a first branch utilizes a novel feedback loop to generate a relative reference current which is summed with the current flowing through the second branch. The first and second branch currents are related to the first and second ECL input voltage levels respectively and the sign of the resultant current summation is therefore related to the sign of the differential input voltage. The result of the current summation is sensed by another switching transistor which in turn drives the TTL output circuitry.

More specifically, first and second differential input means, usually ECL emitter follower output transistors, provide ECL signal levels to an input node in each of respective first and second parallel circuit branches. In the first circuit branch a voltage reference node is connected to a first input node through a resistor and transistor in series in one path and through a current feedback transistor in another path thereby forming a stabilized voltage dropping means. The voltage reference node is also connected to ground through a resistor.

In the second branch the respective second input node is connected to a current summing node through a diode and a resistor in series. Also connected to the current summing node of the second branch is the collector of a current sinking transistor whose base is connected to the voltage reference node of the first branch.

The result of the current summation at the current summing node controls an intermediate output transistor which in turn provides drive to a TTL output drive circuit. In one ECL state, the first input node of the first branch is high, and hence, the voltage reference node is high, the current sinking transistor is in a high state of conductivity and is effectively sinking all current in the second branch where the input node is low thereby causing the base voltage of the connected intermediate driver transistor to be more negative and hence nonconductive. This permits current from the load resistor to which the collector of the intermediate output transistor is connected to supply current to the TTL output driver thereby turning it on which causes the output to go to a low TTL output level.

In a second ECL state, when the first branch ECL input level is low and the voltage reference node is low, the current sinking transistor is less conductive and is hence sinking less current than in the high state of conductivity. At the same time, the respective first input node of the second branch is high and there is more current in the second branch flowing into the current summing node than can be sunk into the current sinking transistor. The excess current is supplied to the base of the intermediate driver transistor whose collector becomes conductive causing a high voltage level to appear at the output of the TTL output driver circuitry.

Thus, it is seen that the dual state ECL logic referenced to a supply voltage is converted to a single TTL state, referenced to ground.

DESCRIPTION OF THE PREFERRED EMBODIMENT

Figure 1:
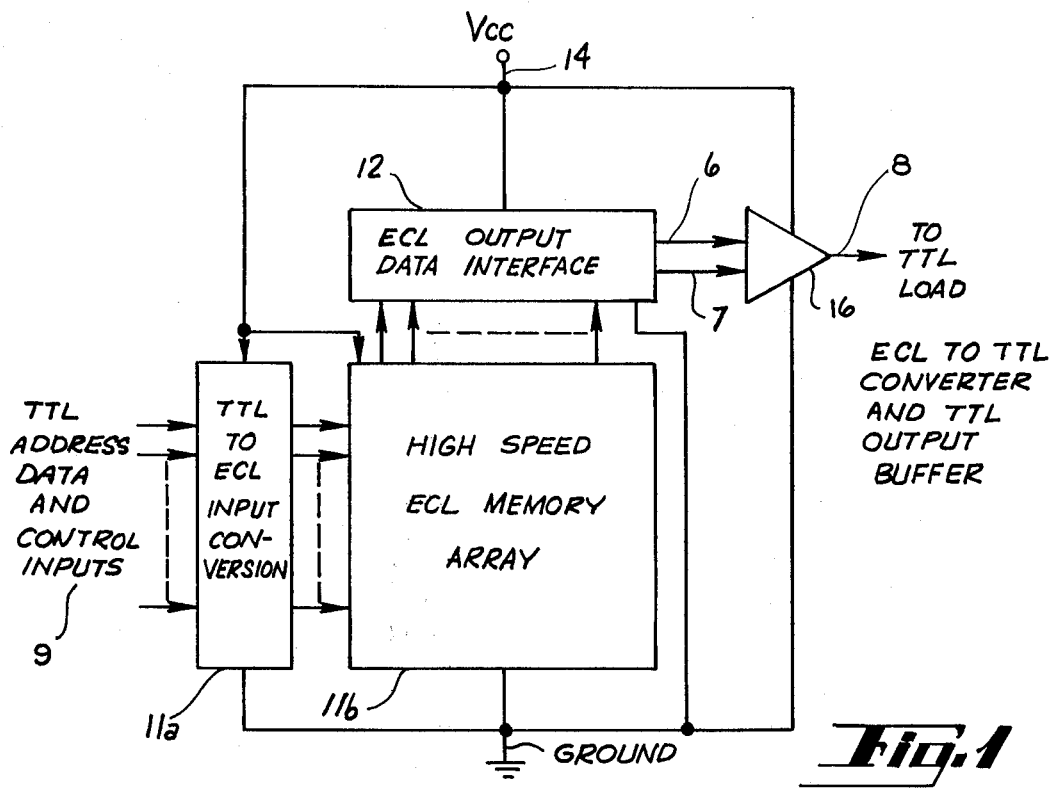
FIG. 1 is a diagram showing representative circuits utilizing different logic levels.

FIG. 1 illustrates a typical circuit application wherein a pair of simultaneously present ECL logic levels designating a single logic state are converted to a single TTL logic level designating the same state. The circuit of FIG. 1 comprises high speed memory 11, a device employing ECL, wherein the memory 11 has TTL compatible address, data and control inputs 9 which are converted to ECL levels internally and drive the basic ECL memory array portion of memory 11. The ECL memory 11 has multiple connections to an interface 12 which is capable of reading data from selected memory locations. The output from interface 12 is a pair of differential ECL logic levels representing the state of the selected memory location and is fed to an amplifier 16 which is powered by the common voltage 14, $V_{CC}$. Amplifier 16 includes the logic level converter of the present invention and a data output buffer.

It will be noted that amplifier 16 has a pair of input lines, each carrying an ECL signal, designated E' and H'. The output from amplifier 16 appears as a single line 8 going to a circuit utilizing TTL.

When an output from high speed memory 11 is read into interface 12, an output is derivied in the form of two simultaneous ECL signals, E and H, on lines 6 and 7. These outputs are fed to amplifier 16 and converted into a single TTL signal designating a logic state corresponding to the two ECL signals.

Figure 2:
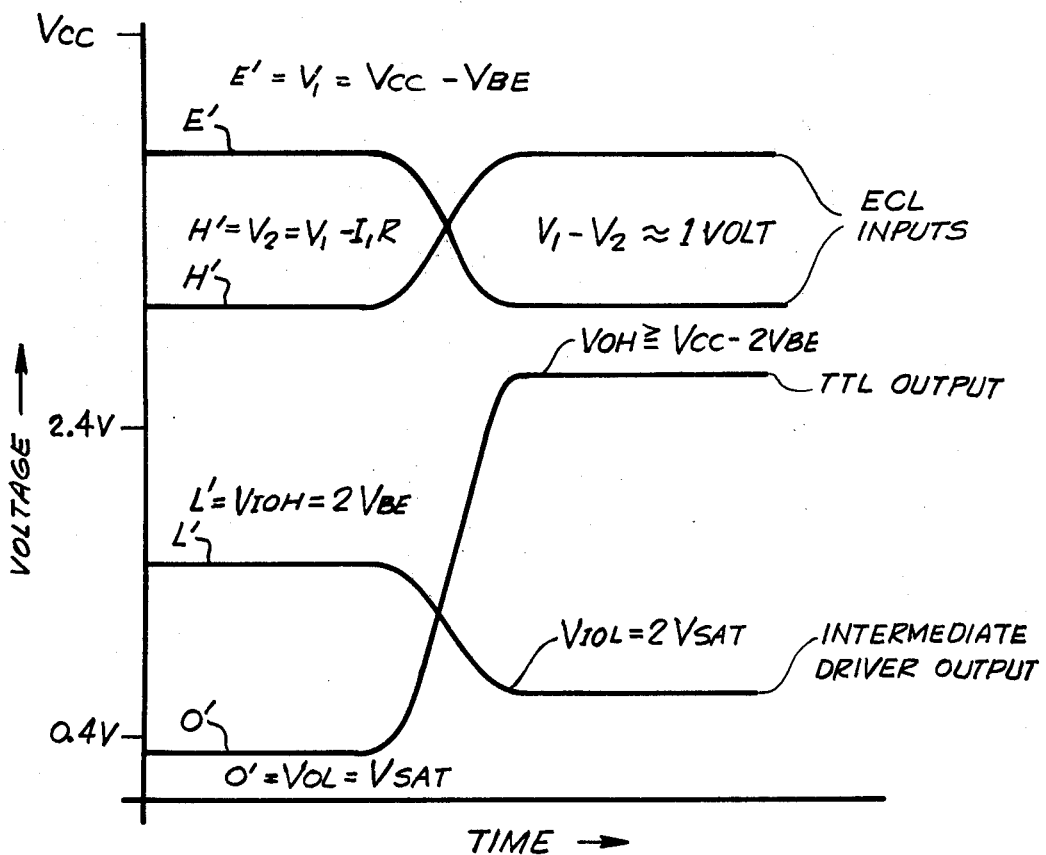
FIG. 2 is a graph indicating simultaneous representative logic levels for a differential ECL input, a corresponding TTL output and an intermediate driving level utilized in the present invention, wherein both ECL and TTL circuits operate from a single positive power supply voltage.

FIG. 2 illustrates typical differential ECL voltage levels for the outputs of interface 12, levels E' and H'. Note that when E' is high, H' is low and when H' is high, E' is low, with a cross-over point between reversals of state.

The curve O' in FIG. 2 represents the TTL output voltage of amplifier 16 in FIG. 1. Note that curve O' is generally similar to curve H', except there is a greater voltage difference between the high and low states and the output is a singular curve, rather than the simultaneous dual output, curves E' and H', characterizing the output of the ECL memory interface 12. It will be seen in FIG. 2 that E' is equal to $V_{CC} - V_{BE}$, wherein $V_{BE}$ is the base to emitter voltage drop across a transistor. On the other hand, the ECL complimentary voltage H' is equal to E' less the ECL logic voltage swing, $I_1R$. The difference between the ECL inputs is approximately 1 volt.

The TTL output voltage has a low state $V_{OL}$ which is equal to $V_{SAT}$, a transistor saturation voltage, while the high TTL output state, $V_{OH}$ must be greater than or equal to $V_{CC} - 2V_{BE}$.

Curve L' is the voltage level at an intermediate output. Voltage level L' is equal to $2V_{BE}$ in a high state and is equal to $2V_{SAT}$ in a low state. It should be noted that each of the voltage levels of FIG. 2: E', H', L', O' is a voltage which corresponds to a voltage level at a node in FIG. 3 which has a corresponding unprimed letter: E, H, L and O. The voltage levels which are indicated on FIG. 2 will be examined with reference to the circuit of FIG. 3.

Figure 3:
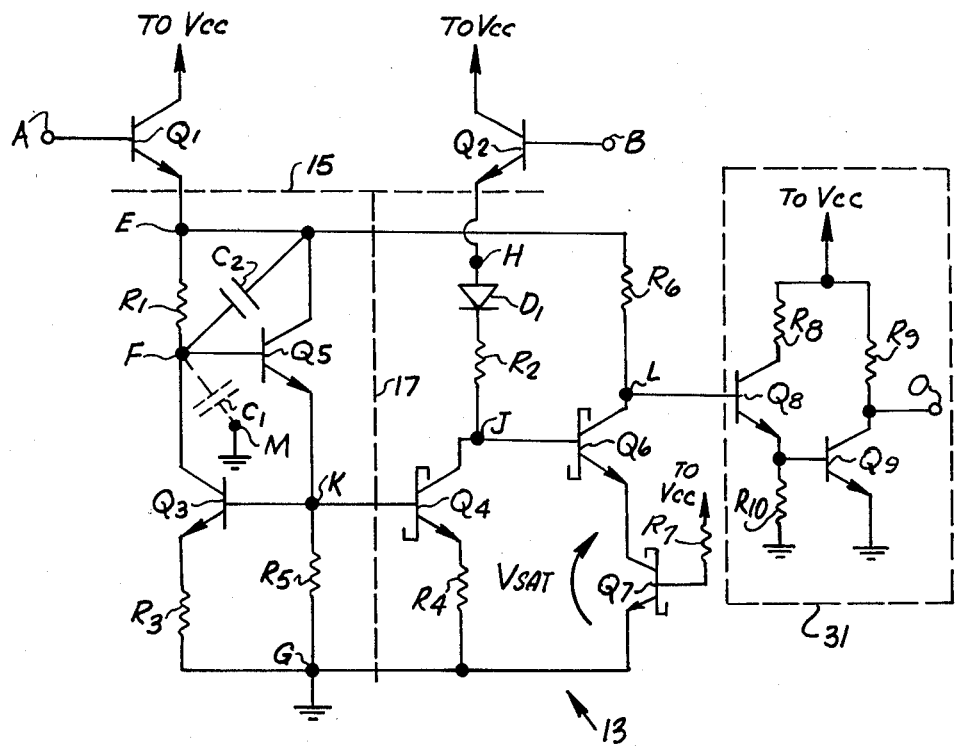
FIG. 3 is a schematic of a logic level converter of the present invention and a typical TTL output buffer stage.

FIG. 3 represents a high speed logic level converter of the present invention. The circuit of FIG. 3 is seen to have first and second input terminals A and B which receive logic levels from the sense amplifier lines 6 and 7 of interface circuit 12 of FIG. 1. Terminals A and B are connected respectively to emitter follower transistors Q1 and Q2 which are part of the output of an ECL logic circuit and not part of the present invention. For this reason the dashed line 15 sets off the first and second ECL input means, transistors Q1 and Q2, from the body of the level converter 13. Thus, while the first and second ECL input means, Q1 and Q2 are connected to the level converter 13, they are not an integral part thereof, but rather connected portions of an ECL apparatus.

It will be seen that the converter 13 includes a first branch, i.e., a branch to the left of dashed line 17 and a second branch to the right hand side of dashed line 17. The first branch includes a first input node, E, connected to the first ECL voltage input means, Q1. The left branch further includes a voltage reference node, K and a pair of signal paths between the input node E and the reference node K. A first signal path from the input node E to reference node K is defined through the collector-base junction capacitance C2 of a first transistor Q5 having its collector connected to node E in parallel with resistor R1, connected to the base thereof on one side at node F and connected to the input node E on the other side of said resistor. The emitter of first transistor Q5 is connected to reference node K thereby completing the first path. It will be noted that input node E of FIG. 3 carries the ECL signal E' of FIG. 2.

A second path between the first input node E and reference node K is defined by a transistor feedback means, i.e., an active feedback means for sensing the voltage on node K and maintaining the reference node K at a voltage level which tracks the voltage level on node E in the first signal path. The feedback transistor Q3 is a current sinking transistor and is connected with its base attached to node K and its collector attached to node F and hence the base of Q5 and one end of resistor R1. The other terminals of R1 and C2 connect to the input node E completing the feedback path which has been previously defined as the second signal path of the first branch.

The operation of the left branch can be described as follows. When a typical ECL input voltage is applied to node E, resistor R1 carries current to the base of transistor Q5. Transistor Q5 is therefore active and its emitter sources current into resistor R5 at node K thereby supplying a voltage to node K. The voltage on node K is greater than the emitter-base turn-on voltage of transistor Q3 and transistor Q3 is active causing current to flow in resistor R3 and the collector of Q3. Resistor Q3 and resistor R3 form a voltage controlled current sink with voltage input at the base of transistor Q3 and current output at the collector of transistor Q3. The collector current of transistor Q3 sinks part of the current flowing through resistor R1 to node F thereby limiting the available base biasing current of transistor Q5. In this manner transistors Q3 and Q5 and resistors R1, R5 and R3 form a closed loop feedback amplifier with input at node E and an output at node K. The circuit containing resistors R1, R5 and R3 and transistors Q3 and Q5 is seen to be a stabilized voltage dropping means such that the voltage at node K is directly related to the voltage at the input node E.

The voltage at node K is the sum of the emitter-base voltage of transistor Q3 and the voltage drop across resistor R3. In the preferred embodiment the value of resistor R3 is much less than the value of resistor R1. Furthermore, the characteristics of transistors Q3 and Q5 and the values of resistors R1, R3 and R5 are such that the base biasing currents of transistor Q3 and Q5 are much less than the currents flowing through resistors R1, R3 and R5. In this sense the currents flowing through R1 and R3 are approximately the same and the resultant voltage drop across resistor R3 is much smaller than the voltage drop across resistor R1. Since the voltage drop across resistor R3 is small, it is seen that the output voltage at node K is in a practical sense referenced to the ground potential at node G.

The resistor R3 is not an essential component in that removing it from the circuit and connecting the emitter of transistor Q3 to ground potential at node G would result in a similar feedback amplifier circuit. However, resistor R3 has been included in the preferred embodiment since it improves the dynamic stability of the circuit, improves the predictability of the voltage gain characteristics of the circuit and eliminates the requirement for precise matching of the emitter-base voltage characteristics of transistor Q3 in the left branch and transistor Q4 in the right branch.

The resistor R5 is included in the circuit to reduce the response time of node K where resistor R5 is in parallel with the actual and ambient capacitance of this node. Resistor R5 also provides a means of causing a current of known magnitude to flow through the emitter-base junction of transistor Q5 which is important in that the current density flowing through transistor Q5 must be known and similar to the current density flowing through diode D1 in the right branch if satisfactory temperature tracking of the right and left branches is to be obtained, one of the objects of the present invention.

With reference to the second branch of circuit 13 a second input node, H, is connected to the second ECL voltage input means, transistor Q2. Thus, one of the two differential ECL output signals is represented at node H.

The second branch further includes a diode D1 and a resistor R2 connected in series, with one end of diode D1 also connected to the second input node H. Diode D1 has forward voltage versus temperature characteristics similar to the emitter-base junction of transistor Q5, as further described below. The path from input node H to current summing node J through diode D1 and resistor R2 form a voltage dropping means between said nodes. It will be noted that input node H of FIG. 3 carries the ECL signal H' of FIG. 2.

Transistor Q4 and resistor R4 form a second voltage controlled current sinking circuit with voltage input at the base of transistor Q4 and current output at the collector of transistor Q4 which is connected to current summing node J. The base of transistor Q4 is connected to node K. Therefore the amount of current which can be sunk at the collector of Q4 is related to the potential present at node K and the input potential at node E to which it is related. The voltage drop across resistor R4, which is connected between the emitter of transistor Q4 and the ground node G, tracks the voltage drop across resistor R3 in the left branch. Hence if resistor R3 is eliminated from the circuit in the left branch in an alternative embodiment as described previously, resistor R4 should likewise be eliminated and the emitter of transistor Q4 should be connected to the ground node G in the right branch.

Current summing node J is also connected to the base of the intermediate driver transistor Q6, which has a collector connected to an intermediate output node L, which in turn is connected through resistor R6 to the first input node E and to the input of the TTL output buffer 31. The emitter of Q6 is connected to the collector of transistor Q7 which in turn has an emitter which is connected to ground and a base which is connected to $V_{CC}$ through resistor R7. Q7 operates in a saturated mode and provides a collector to emitter saturation voltage, $V_{SAT}$, to the emitter of Q6, thereby referencing the emitter of Q6 above ground at all times. This is done to increase the input turn on voltage of transistor Q6 which becomes necessary if the voltage drop across resistor R4 is appreciable. Transistor Q7 and its base current biasing resistor could be eliminated and a simple diode with anode connected to the emitter of Q6 and cathode connected to ground node G. If the resistors R3 and R4 are eliminated from the circuit as previously discussed then the input threshold voltage at the base of transistor Q6 need not be increased. In this alternative embodiment, the emitter of Q6 can be connected to ground at node G and transistor Q7 and associated resistor R7 may be eliminated. The resistor ratios of R1 to R3 and R2 to R4 are selected to be approximately the same.

Two output signals are possible at intermediate output node L', a first signal, $V_{IOH}$, which occurs when node E is high and node H is low; and a second output voltage, $V_{IOL}$, when the complimentary ECL inputs appear at nodes E and H, i.e., node E is low and node H is high. These signal states drive the TTL output buffer stage identified within dashed line 31. The TTL output interface 31 comprises a pair of driver transistors Q8 and Q9 which are biased by $V_{CC}$ through resistors R8 and R9 connected to respective collectors of the transistors Q8 and Q9. A TTL output is taken from the collector of transistor Q9.

Operation of circuit 13 may further be explained as follows. In FIG. 2, dual curves E' and H' may be seen which are the simultaneous voltage levels at nodes E and H respectively derived from typical ECL input voltage means Q1, Q2 respectively. Curve H is initially low and curve E is initially at a high state. As emitter followers, Q1 and Q2 are always on. When node E is high Q4 is in a high conductivity state, i.e., saturation, and Q6 is off. Q6 is off because the base of Q6 is driven negative inasmuch as current coming down the right hand branch from node H, which is now at the lower ECL input level, through diode D1 and resistor R2 to node J is being sunk into the collector of Q4 as fast as it comes down the second branch. In this state the intermediate output potential at node L resides at the high level called $V_{IOH}$ in FIG. 2. The voltage to which node L can rise in response to the current flowing through R6 is limited by the forward biased emitter-base voltages of transistors Q8 and Q9 in the output buffer circuit 31. Since Q8 and Q9 are both on at this time the TTL output node O is low and has the output voltage labeled $V_{OL}$ in FIG. 2.

When the ECL states reverse, with node H high and node E low, reference node K drops to a lower voltage, sensing the lower voltage at node E through transistors Q3 and Q5, and transistor Q4 becomes less conductive. Thus, the collector of Q4 is sinking less current than in the reverse state and less than is coming down the second branch. Increased current is flowing in the second branch because node H is high. The excess current in the right hand branch is driven into the base of transistor Q6 since it cannot go into the collector of Q4 thereby driving the collector of Q6 to a high conductivity state. The collector current of Q6 flows through resistor R6, creating a voltage drop across R6. Since the other end of resistor R6 connects to node E which is now at its lower voltage input state, transistor Q6 becomes easily saturated. Thus it can be seen that the connection of R6 between input node E and intermediate output node L forms a feed forward path. The connection of resistor R6 from the intermediate output node L to the left branch input node E enhances the circuit's ability to drive the capacitance C2 by maintaining the output impedance of the ECL input driving means Q1 at a low level and also by providing a controlled positive feedback path from the intermediate output node L to the input node E. In other words, the aforementioned connection through R6 is both a feed forward and a positive feedback means. The voltage on the intermediate output node L becomes the sum of the collector to emitter saturation voltages of transistors Q6 and Q7. This low level is labeled $V_{IOL}$ in FIG. 2. Since this voltage is lower than the input threshold of the TTL output buffer 31, transistor Q9 is off and the output voltage at node O goes to $V_{OH}$.

The temperature compensating characteristics of diode D1 were previously discussed. The function of diode D1 is principally that of providing temperature compensation for the P-N junction of Q5 between node F and reference node K of the left hand branch such that the threshold voltage at current summing node J will track the input characteristics present at the base of Q6. Thus, the diode D1 is merely a P-N junction whose temperature characteristics are similar to the emitter-base diode temperature characteristics of Q5.

To maintain the high speed characteristic of ECL logic in performing the logic level conversion, it is necessary that the ambient, internal capacitance of circuit 13 be charged and discharged as rapidly as possible. Such ambient capacitance is represented in dashed lines by the capacitor C1 shown connected between nodes F and M associated with the left branch. By increasing the parasitic capacitance inherent in the base to collector junction of Q5, represented by the capacitor C2 between nodes F and E in FIG. 3, the ambient capacitance of C1 may be charged and discharged rapidly.

Figure 4:
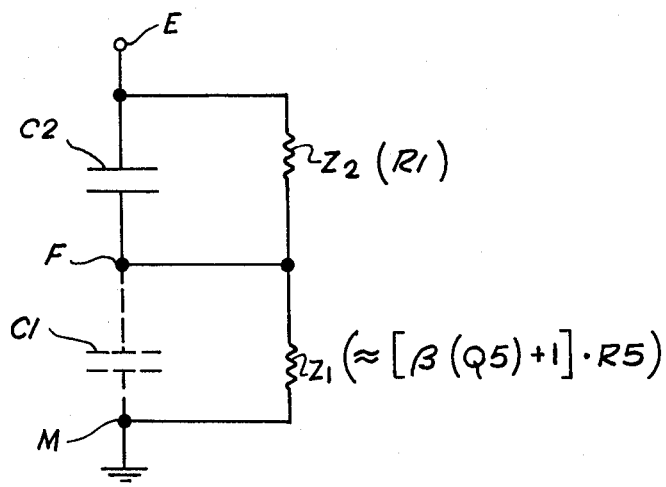
FIG. 4 is an explanatory schematic representation of a portion of the circuit of FIG. 3.

An equivalent circuit is seen in FIG. 4 where the respective capacitances C1 and C2 are seen to be in parallel with the circuit resistances Z1 and Z2. The ambient capacitance C1 is in parallel with the overall circuit impedance which is relatively large, for example 100 kilohms. On the other hand, the parasitic capacitance of the base-collector junction of Q5 is in parallel with the resistance R1 which is an order of magnitude smaller, for example 10 kilohms. These resistances are only illustrative and actual resistances may vary significantly.

To rapidly charge or discharge the ambient capacitance C1, a value for the parasitic capacitance C2 is selected to be approximately an order of magnitude greater than C1, thereby forming a compensation network. For example, if C1 is 1 picofarad, C2 would be selected to be approximately 10 picofarads. Thus it will be seen that the overall delay time from node E to node F can be made to approach zero for the circuit of FIG. 4 if a large capacitance C2 is included as shown. Using integrated circuit processing and/or design technology, it is relatively simple to increase the capacitance of base-collector junction of Q5 by a manner well known to those skilled in the art. Such parasitic capacitance is an approximate order of magnitude, i.e., 10 times, greater than the ambient capacitance measured at point F and represented by C1.

Figure 5:
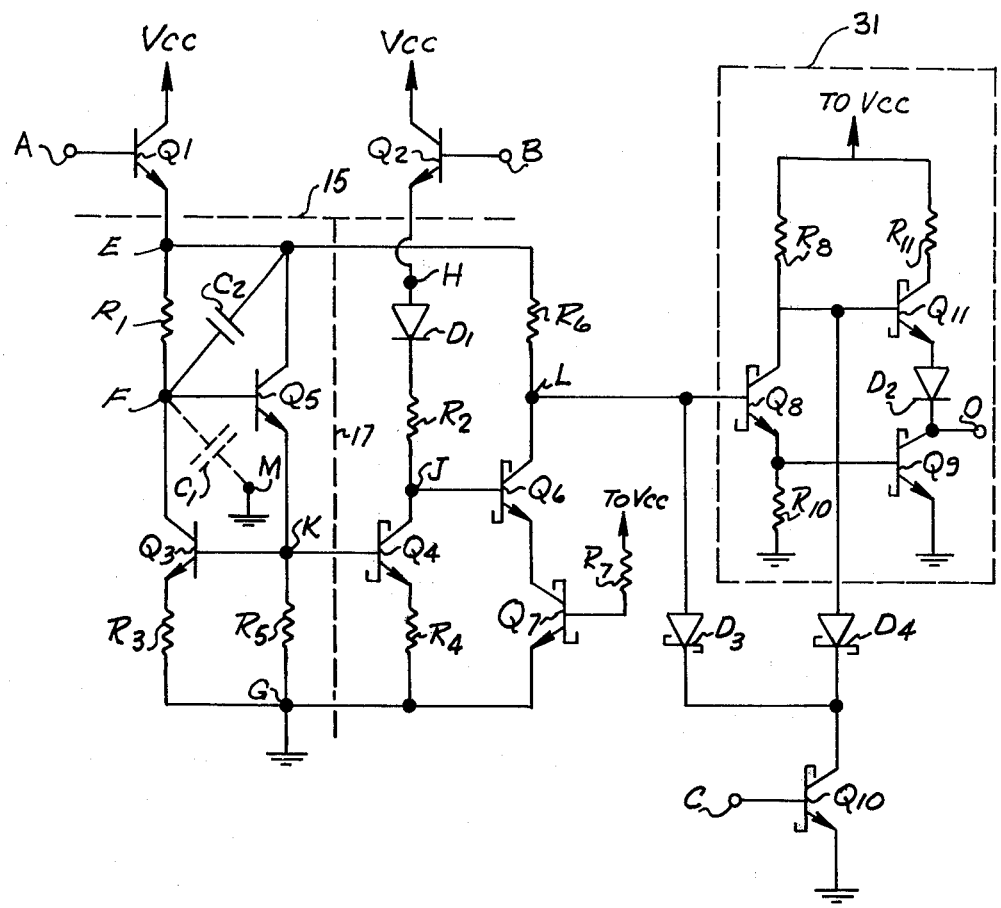
FIG. 5 is a schematic of an alternate logic level converter of the present invention illustrating compatibility of the invention with conventional three state output disabling means.

FIG. 5 shows an alternate embodiment of the apparatus of FIG. 3. This embodiment is appropriate when TTL three state output logic is desired. The third TTL state, not shown in FIG. 2, is a disabled state wherein the output node O is left in a high impedance state. Such a state is generated by applying a positive current to node C causing transistor Q10 of FIG. 5 to turn on and saturate. This causes current to flow through diode D3 connected to intermediate output node L and through diode D4 connected to the TTL high level output drive circuitry R8, R11, Q11 and D2. In effect, this causes the TTL output to be disabled since under these conditions it can not drive the output node to either of the other output levels, $V_{OL}$ or $V_{OH}$ regardless of the state of inputs E and H. Disabling transistor Q10 by removing the base current node C causes current through D3 and D4 to cease flowing thereby enabling normal operation of the level converter of the present invention and the TTL output buffer, as described previously.

In other respects, the operation of FIG. 5 is similar to that described with reference to FIG. 3.

While the circuit described herein is especially suitable for translating logic levels from ECL circuits to TTL circuits, the same apparatus could be used for translating between other logic levels which have similar characteristics to those described herein. The constructional technology implied herein, Schottky diode clamped bipolar, could also be other technology, including standard ECL or gold doped TTL. For increased speed, it is helpful but not necessary to clamp the collector-base junctions of transistors Q4 and Q6 with Schottky barrier diodes.

I claim:

1. A logic level converter for converting ECL characterized by at least first and second ECL input means for producing dual high and low ECL input signals, to a single TTL for driving a TTL load through a TTL output driver comprising,
   a first circuit branch having a first input node, connected for receiving a signal from said first ECL input means, a reference node whose potential is adjustable with reference to ground and a temperature compensated, stabilized voltage dropping means between said first input and reference nodes, said input node connected to said first ECL input means.
   a second circuit branch having a second input node connected for receiving a signal from said second ECL input means, a current summing node and a temperature compensated voltage dropping means between said second input and current summing node,
   a current sinking transistor having a current sinking electrode connected to said current summing node of said second circuit branch, a bias electrode connected to said reference node of said first circuit branch for establishing the current sinking amount of said current sinking transistor, and an emitter electrode communicating with ground through a first resistive element,
   an intermediate driver transistor having an input electrode connected to said current summing node and an output electrode adapted for connection to a TTL output driver whereby said output driver drives said TTL load to a high TTL state when current in said second branch exceeds the amount of current sunk by the current sinking transistor and in a low TTL output state when current in said second branch is less than the amount of current sunk by the current sinking transistor.

2. The apparatus of claim 1 wherein said stabilized voltage dropping means of said first branch includes first and second signal paths between said first input node and said reference node of said first branch, the first of said signal paths having means including a first transistor with a collector connected to said first input node and a resistor also connected to said first input node for dropping voltage between said input and reference nodes; said second signal path having active feedback means for sensing current in said first transistor and for maintaining said reference node at a stabilized voltage level tracking the voltage drop in said first signal path.

3. The apparatus of claim 2 wherein said active feedback means is a feedback transistor having a base connected to said reference node of said first branch, a collector connected to said input of said first transistor, an emitter communicating with ground through a second resistive element, and a known base-emitter temperature dependence characteristic.

4. The apparatus of claim 1 wherein said first transistor has a known base-emitter temperature dependence characteristic forming a portion of said temperature compensated voltage dropping means of said first circuit branch.

5. The apparatus of claim 4 wherein said second circuit branch includes a diode having a P-N junction temperature dependence characteristic which is equal to the base-emitter temperature dependence characteristic of said first transistor in the first branch, thereby forming a portion of said temperature compensated, voltage dropping means in said second circuit branch.

6. The apparatus of claim 1 further defined by a simultaneous feed forward and feedback loop connecting said output electrode of said intermediate driver transistor to said first input node of said first branch.

7. The apparatus of claim 2 wherein said first transistor has substantially increased base-collector capacitance relative to ambient capacitance at the base of said first transistor.

8. The apparatus of claiim 1 wherein said current sinking transistor and said intermediate driver transistor are clamped.

9. The apparatus of claim 1 wherein said intermediate driver transistor includes means for referencing said intermediate driver transistor above ground.

10. The apparatus of claim 1 further defined by disabling circuit means for disabling the high level output drive and the low level drive of said TTL output driver, thereby leaving said driver output in a high impedance state without causing excessive currents to flow.

11. The apparatus of claim 10 wherein said disabling circuit means includes a grounded emitter transistor having a collector connected through a diode to the output electrode of said intermediate driver transistor.

* * * * *

UNITED STATES PATENT OFFICE
CERTIFICATE OF CORRECTION

Patent No. 3,986,045                                Dated October 12, 1976

Inventor(s) Robert Clare Lutz

It is certified that error appears in the above-identified patent and that said Letters Patent are hereby corrected as shown below:

Col. 1, line 30,        Between "ECL" and "can", insert --logic--;

Col. 1, line 51,        Between "is" and "highly", delete "a".

Col. 3, line 61,        Change "derivied" to "derived".

Col. 9, line 16,        After "means", change the period to a comma.

Col. 10, line 33,       Change "claiim" to "claim".

Signed and Sealed this

Seventeenth Day of May 1977

[SEAL]

Attest:

RUTH C. MASON
*Attesting Officer*

C. MARSHALL DANN
*Commissioner of Patents and Trademarks*